(12) United States Patent
Moczygemba

(10) Patent No.: US 7,871,847 B2
(45) Date of Patent: Jan. 18, 2011

(54) SYSTEM AND METHOD FOR HIGH TEMPERATURE COMPACT THERMOELECTRIC GENERATOR (TEG) DEVICE CONSTRUCTION

(75) Inventor: Joshua E. Moczygemba, Wylie, TX (US)

(73) Assignee: Marlow Industries, Inc., Dallas, TX (US)

( * ) Notice: Subject to any disclaimer, the term of this patent is extended or adjusted under 35 U.S.C. 154(b) by 123 days.

(21) Appl. No.: 12/240,562

(22) Filed: Sep. 29, 2008

(65) Prior Publication Data

US 2009/0093078 A1  Apr. 9, 2009

Related U.S. Application Data

(60) Provisional application No. 60/977,864, filed on Oct. 5, 2007.

(51) Int. Cl.
| H01L 21/00 | (2006.01) |
| H01L 21/331 | (2006.01) |
| H01L 21/8222 | (2006.01) |
| H01L 21/30 | (2006.01) |
| H01L 21/46 | (2006.01) |

(52) U.S. Cl. ............... 438/55; 438/455; 438/48; 438/309

(58) Field of Classification Search ............... 438/55, 438/22, 122, 26, 455, 48, 309, 87, 81, 54
See application file for complete search history.

(56) References Cited

U.S. PATENT DOCUMENTS

| 3,775,218 A | 11/1973 | Hare et al. ............... 156/331 |
| 3,780,425 A | 12/1973 | Penn et al. ............... 29/573 |
| 5,952,728 A * | 9/1999 | Imanishi et al. ............... 62/3.2 |
| 6,027,887 A | 2/2000 | Zavada et al. ............... 435/6 |
| 6,232,542 B1 | 5/2001 | Hiraishi et al. ............... 136/201 |
| 6,252,154 B1 | 6/2001 | Kamada et al. ............... 136/201 |
| 7,061,073 B2 | 6/2006 | Dahl et al. ............... 257/532 |

\* cited by examiner

*Primary Examiner*—Chuong A. Luu
(74) *Attorney, Agent, or Firm*—Baker Botts L.L.P.

(57) ABSTRACT

A method for creating an array of thermoelectric elements includes applying a first coating of dielectric material to P-type wafers and N-type wafers to form coated P-type wafers and coated N-type wafers. A P/N-type ingot is formed from the coated P-type wafers and the coated N-type wafers. The coated P-type wafers and the coated N-type wafers are alternatingly arranged in the P/N-type ingot. P/N-type wafers comprising P-type elements and N-type elements are sliced from the P/N-type ingot and a second coating of the dielectric material is applied to the P/N-type wafers to form coated P/N-type wafers. Furthermore, a P/N-type array from the coated P/N-type wafers.

21 Claims, 4 Drawing Sheets

SYSTEM AND METHOD FOR HIGH TEMPERATURE COMPACT THERMOELECTRIC GENERATOR (TEG) DEVICE CONSTRUCTION

CROSS REFERENCE TO RELATED APPLICATIONS

This application claims the benefit under 35 U.S.C. §119 (e) of U.S. Provisional Application No. 60/977,864, entitled "System and Method for High Temperature Compact Thermoelectric Generator (TEG) Device Construction," filed Oct. 5, 2007.

TECHNICAL FIELD

The present disclosure relates to thermoelectric devices and more specifically to a system and method for high temperature compact thermoelectric generator (TEG) device construction.

BACKGROUND

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of the materials used in fabrication of the associated thermoelectric elements. Materials used to fabricate other components such as electrical connections, hot plates and cold plates may also affect the overall efficiency of the resulting thermoelectric device. Typically, a thermoelectric device incorporates both P-type and N-type semiconductor alloys as the thermoelectric materials in the elements of the thermoelectric device.

SUMMARY

In particular embodiments, a method for creating an array of thermoelectric elements includes applying a first coating of dielectric material to P-type wafers and N-type wafers to form coated P-type wafers and coated N-type wafers. A P/N-type ingot is formed from the coated P-type wafers and the coated N-type wafers. The coated P-type wafers and the coated N-type wafers are alternatingly arranged in the P/N-type ingot. P/N-type wafers comprising P-type elements and N-type elements are sliced from the P/N-type ingot and a second coating of the dielectric material is applied to the P/N-type wafers to form coated P/N-type wafers. Furthermore, a P/N-type array from the coated P/N-type wafers.

In particular embodiments, the method further includes removing the dielectric material from a top surface and a bottom surface of the P/N-type array to expose faces of the P-type elements and the N-type elements and trimming the P/N-type array to shorten the P-type elements and the N-type elements to a desired length. In particular embodiments, a thermoelectric device may be formed from the P/N-type array by applying electrical interconnects to the faces of the P-type elements and the N-type elements, and a third coating of the dielectric material may be applied to the thermoelectric device.

In particular embodiments, the P/N-type ingot may be formed by applying adhesive to the coated P-type wafers and the coated N-type wafers, stacking the coated P-type wafers and the coated N-type wafers in an alternating relationship, pressing the coated P-type wafers and the coated N-type wafers together to decrease widths of first bond lines between coated P-type wafers and the coated N-type wafers, and curing the adhesive to form the P/N-type ingot. Depending upon design, the coated P-type wafers and the coated N-type wafers may be pressed together until they touch one another along the first bond lines.

In particular embodiments, the P/N-type array may be formed by applying the adhesive to the coated P/N-type wafers, stacking the coated P/N-type wafers, pressing the coated P/N-type wafers together to decrease widths of second bond lines between coated P/N-type wafers, and curing the adhesive to form a P/N-type block and slicing the P/N-type array from the P/N-type block. Depending upon design, the coated P/N-type wafers may be pressed together until they touch one another along the second bond lines.

In particular embodiments, any excess adhesive that is squeezed out of the first bond lines or the second bond lines may be removed.

In particular embodiments, the dielectric material may include a high temperature dielectric material adapted to withstand a full range of operating temperatures produced by a thermoelectric device built from the thermoelectric array.

In particular embodiments, the first coating may be uniform in thickness, the second coating may be uniform in thickness, and depending upon design, the first coating may be equal in thickness to the second coating.

In particular embodiments, the P/N-type wafers may be arranged such that the P-type elements and the N-type elements form a checkerboard pattern in the P/N-type array.

In particular embodiments, the P-type wafers and the N-type wafers may be uniform to one another in dimension.

Technical advantages of particular embodiments of the present disclosure may include providing a method for producing a thermoelectric device having extremely thin insulating layers between adjacent thermoelectric elements in the device. Because the coefficient of thermal expansion (CTE) of the insulating material may be much greater than the CTE of the thermoelectric elements, providing extremely thin insulating layers may reduce the overall expansion caused by the insulating material between the TE elements, thereby lessening the stresses caused by expansion of the insulating material at high operating temperatures, yet another technical advantage. Furthermore, providing extremely thin insulating layers may reduce the amount of thermal leakage (e.g., thermal shorting) caused by the insulating material, yet another technical advantage.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following descriptions, taken in conjunction with the accompanying drawings, in which.

DETAILED DESCRIPTION

Figure 1:
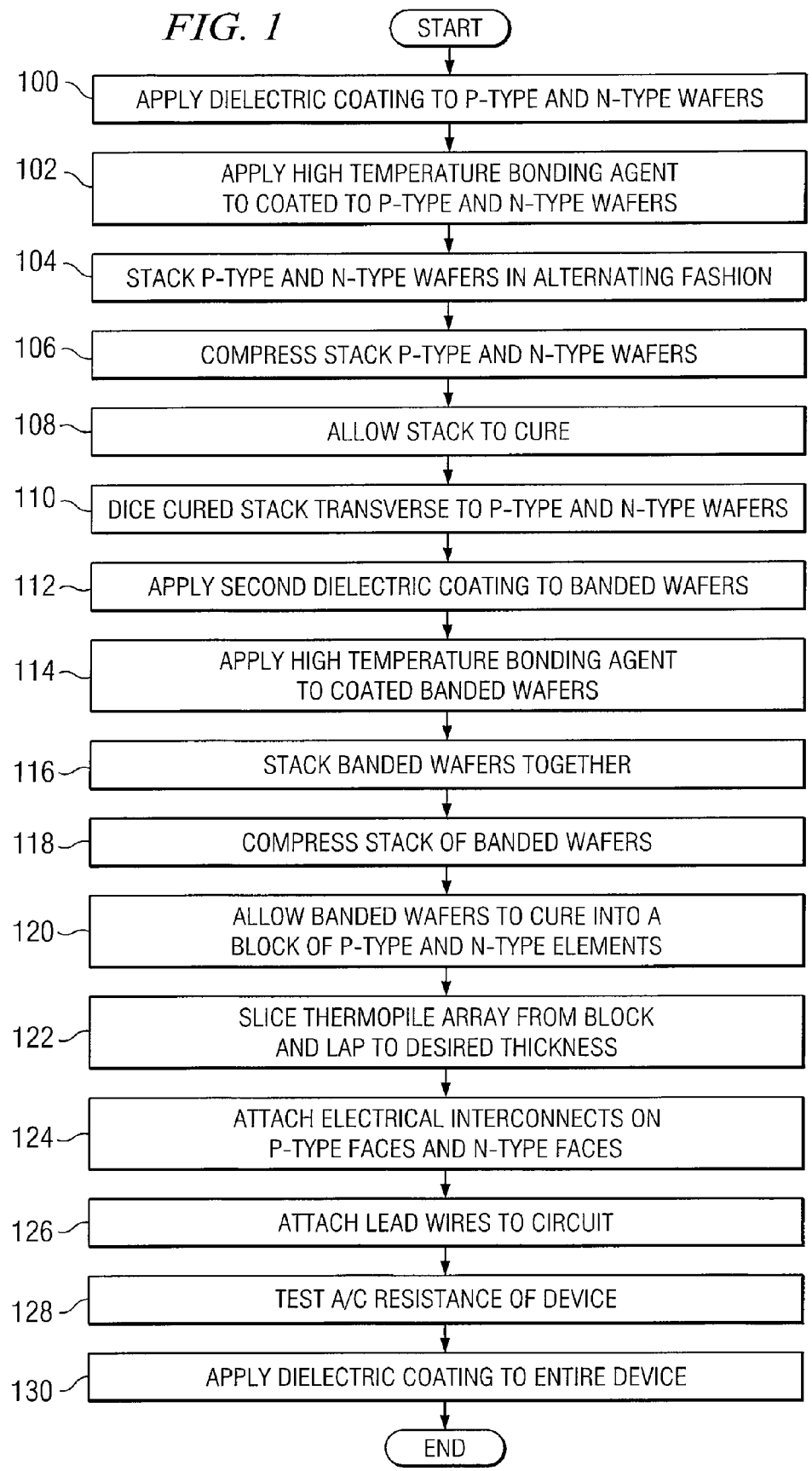
FIG. 1 illustrates example steps in a method for high temperature compact thermoelectric generator (TEG) device construction.

FIG. 1 illustrates example steps in a method for manufacturing a high temperature compact thermoelectric device (e.g., a thermoelectric generator "TEG") in accordance with an example embodiment of the present disclosure. Various steps of the example method presented in FIG. 1 are further illustrated and described with respect to FIGS. 2-8. The method begins at step 100 where P-type wafers 202a and N-type wafers 202b of thermoelectric material are coated with a high temperature dielectric coating 200. The method continues at step 102 where a bonding agent 208 is applied to the coated P-type wafers 202a and N-type wafers 202b. In particular embodiments, step 102 may include any pre-cure steps associated with applying bonding agent 208. The method continues at step 104 where the coated P-type wafers 202a and N-type wafers 202b are stacked together in an alternating fashion into a stack 206. At step 106 the coated P-type wafers 202a and N-type wafers 202b may be compressed together to minimize the bond line thickness between the coated wafers 202 such that the respective faces of each coated wafer 202 touch one another at various points along the bond lines 204, and at step 108 the adhesive in stack 206 is cured.

The method continues at step 110 where stack 206 is diced in a direction transverse to the P-type wafers 202a and N-type wafers 202b (e.g., perpendicular to bond lines 204), thereby creating a number of banded wafers 212. The banded wafers are coated with dielectric coating 200, and at step 114 bonding agent 208 is applied to coated wafers 212. In particular embodiments, step 114 may include any pre-cure steps associated with applying bonding agent 208. The method continues at step 116 where banded wafers 212 are stacked together, and at step 118, the banded wafers 212 may be compressed together to minimize the bond line thickness between the coated wafers 212 such that the respective faces of each coated bonded wafer touch one another at various points along the bond area between adjacent wafers 212. The method continues at step 120 where the bonding agent 208 between the banded wafers 212 is cured forming a solid block 216 of P-type elements 214a and N-type elements 214b.

The method continues at step 122 where a thermopile array 218 is sliced from the top of block 216 and lapped to a desired thickness. At step 124 electrical interconnects may be applied to the P-type elements 214a and N-type elements 214b to create circuits for a TE device 226. In particular embodiments, the method continues at step 126 where lead wires 230 may be attached, and at step 128 the TE device 226 may be resistance tested as well as Z-tested. The method continues at step 130 where TE device 226 (e.g., the entirety of TE device 226) may be coated with a dielectric coating 200, after which, the method ends.

Figure 2:
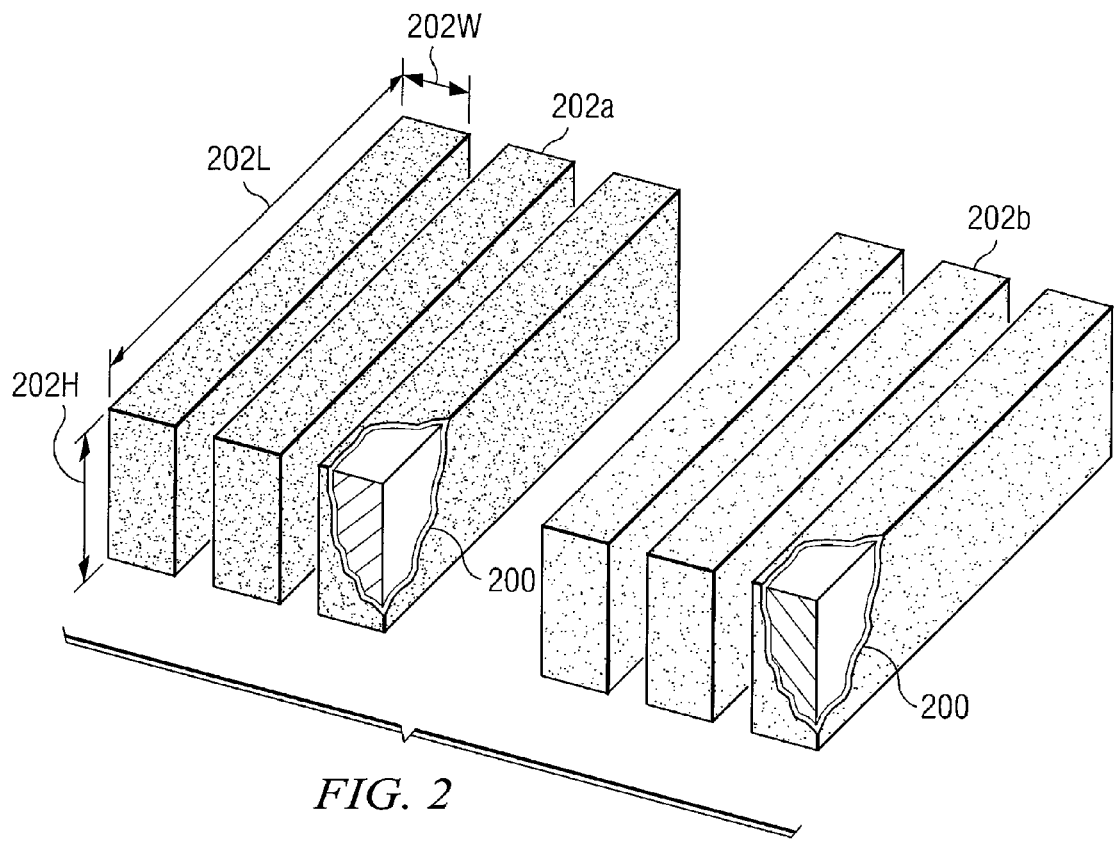
FIG. 2 illustrates an example embodiment of a plurality of P-type wafers and N-type wafers coated with a dielectric coating in accordance with an example embodiment of the present disclosure.

FIG. 2 illustrates a number of P-type wafers 202a and N-type wafers 202b that have been coated with a dielectric coating 200 such as for example in step 100 of FIG. 1. P-type wafers 202a and N-type wafers 202b may be composed of any thermoelectric material suitable for use in a thermoelectric device. As an example and not by way of limitation, P-type wafers 202a and N-type wafers 202b may be composed of, Skutterudites, TAGS (Tellurium/Silver/Germanium/Antimony), Clathrates, Bismuth-telluride based material ($Bi_2Te_3$), or Lead-telluride based material (PbTe). The thermoelectric material used in wafers 202 may affect the range of operating temperatures of the thermoelectric device 226 built from wafers 202. For example, a $Bi_2Te_3$-based thermoelectric device 226 may have a maximum operating temperature around 250 degrees Celsius while a PbTe-based thermoelectric device 226 may have a maximum operating temperature in excess of 350 degrees Celsius.

Each wafer 202 may have a wafer height 202H, a wafer length 202L, and a wafer width 202W. Though wafers 202 may be any shape or size, a typical wafer 202 may be rectangular in shape, having two large, substantially flat faces surrounded by four narrow edges. By way of example, a wafer 202 could have a wafer width 202W of approximately 0.7 mm, a wafer height 202H of approximately 25 mm, and a wafer length 202L of approximately 12 mm. In particular embodiments, each wafer 202 may be uniform to every other wafer 202 in dimension (e.g., length, width, and height). One of ordinary skill in the art will appreciate that the above-described embodiments of P-type wafers 202a and N-type wafers 202b were presented for the sake of explanatory simplicity and will further appreciate that the present disclosure contemplates using any suitable configuration and composition of thermoelectric of wafer 202.

Dielectric coating 200 may be any formula or compound capable of providing an electrically and thermally insulating barrier between P-type wafers 202a and N-type wafers 202b and having a relatively low thermal conductivity. As an example and not by way of limitation, dielectric coating 200 could be PARYLENE HT, having a thermal conductivity of approximately 0.096 W/mK. As additional examples and not by way of limitation, dielectric coating 200 could be an epoxy such as Epo-Tek 353ND, a polyimide adhesive such as BR680, or a polysulfone-based polymer. In particular embodiments, the material used for dielectric coating 200 may be chosen according to its ability to withstand high temperatures (e.g., temperatures commensurate with the operating temperatures of a TE device 226) without breaking down. One of skill in the art will appreciate that the above-described embodiments of dielectric coating 200 were presented for the sake of explanatory simplicity and will further appreciate that the present disclosure contemplates using of any suitable compound or formula for dielectric coating 200 having a relatively low thermal conductivity and capable of providing an electrically and thermally insulating barrier between P-type wafers 202a and N-type wafers 202b.

In particular embodiments, dielectric coating 200 may completely coat P-type wafers 202a and N-type wafers 202b and may prevent oxidation or sublimation of wafers 202. As an example and not by way of limitation, dielectric coating 200 may be a uniform coating of dielectric material approximately 12 microns thick, though any suitable coating thickness is contemplated. Dielectric coating 200 may be applied to wafers 202 using any suitable deposition technique. As an example and not by way of limitation, dielectric coating 200 may be applied by chemical vapor deposition, sputtering, evaporation, screen printing, or doctor blading. After dielectric coating 200 has been applied to wafers 202, wafers 202 may be allowed to cure, if necessary. One of skill in the art will appreciate that the above-mentioned deposition techniques were described for the sake of explanatory simplicity and will further appreciate that the present disclosure contemplates the use of any suitable means of deposition to deposit dielectric coating 200 on P-type wafers 202a and N-type wafers 202b. In particular embodiments, after dielectric coating 200 has been deposited on wafers 202 and cured if necessary, wafers 202 may be bonded together as explained in more detail with respect to FIG. 3.

Figure 3:
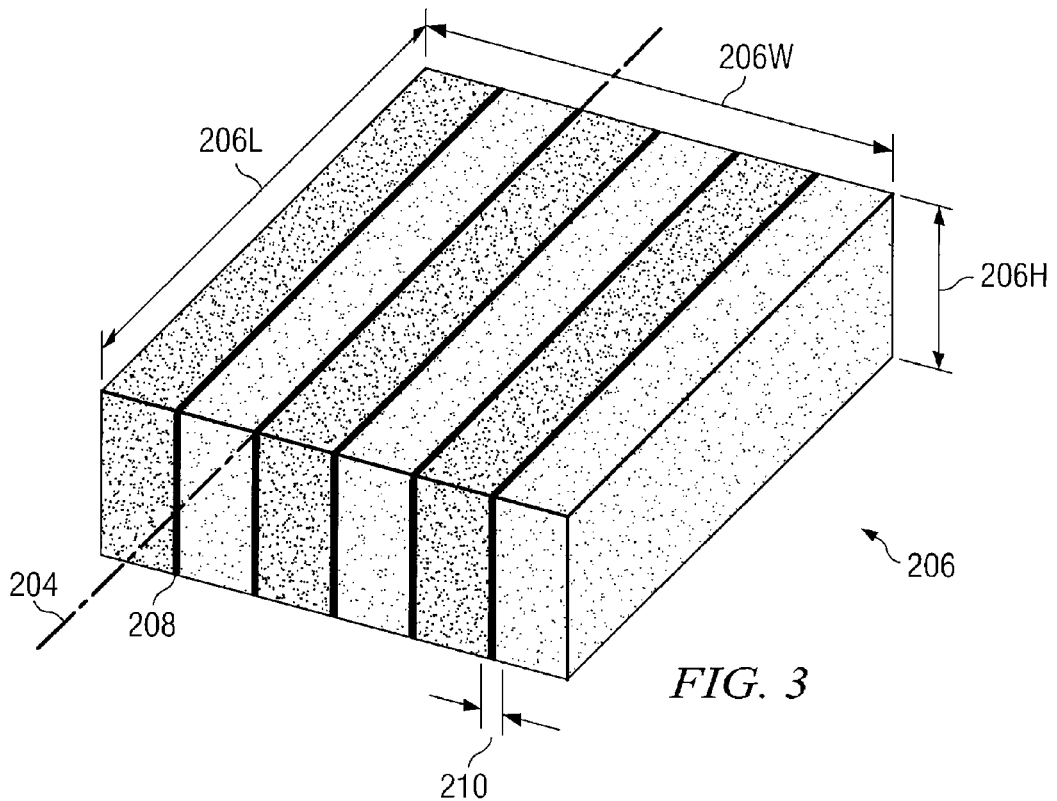
FIG. 3 illustrates an example embodiment of a bonded stack of the P-type wafers and N-type wafers of FIG. 2.

FIG. 3 illustrates a stack 206 of dielectric-coated P-type wafers 202a and N-type wafers 202b that have been alternating arranged and bonded together using a high temperature bonding agent 208 in accordance, for example, with steps 102-108 of FIG. 1. Stack 206 may be defined by a stack height 206H, a stack length 206L, and a stack width 206W. Though stack 206 may include any suitable number of wafers 202 and may be any size or shape, in an example design, stack 206 may include approximately 16 wafers 202 (e.g., 8 P-type wafers 202a and 8 N-type wafers 202b). Assuming stack 206 is constructed from wafers 202 having dimensions similar to the example dimension discussed above with respect to FIG. 2, stack 206 may have a stack height 206H of approximately 25 mm, a stack length of approximately 12 mm, and a stack width of approximately 12 mm.

In particular embodiments, the bonding agent 208 used to bond stack 206 together may be any electrically insulating compound or formula that, after curing, is capable of maintaining a rigid bond between P-type wafers 202a and N-type wafers 202b throughout the range of operating temperatures thermoelectric device 226. As examples and not by way of limitation, bonding agent 208 may be a high temperature epoxy such as Epo-Tek 353ND, a polyimide adhesive, or a ceramic material. In an example situation, polyimide may be used as the bonding agent 208 for lead-telluride based wafers 202 while Epo-Tek 353ND may be used as the bonding agent 208 for bismuth-telluride based wafers 202. One of skill in the art will appreciate that the above-mentioned high temperature bonding agents 208 were described for the sake of explanatory simplicity and will further appreciate that the present disclosure contemplates the use of any suitable high temperature bonding agents to bond wafers 202 together.

In particular embodiments, after bonding agent 208 has been applied to wafers 202 and wafers 202 have been stacked together into stack 206, wafers 202 may be pressed together to reduce the width of the bond lines 204 between wafers 202. Typically, when wafers 202 are pressed together reduce the amount of space between each adjacent wafer 202, the faces of one or more adjacent wafer 202 may touch one another at particular locations along bond lines 204. In particular embodiments, any excess bonding agent 208 that is squeezed out of bond lines 204 when stack 206 is compressed may be removed (e.g., scraped away) before bonding agent 208 cures (e.g., hardens). To compress stack 206, a clamp may be applied to the endmost wafers 202 in stack 206 and tightened; however, one of ordinary skill in the art will appreciate that an suitable mechanism may be used to apply compressive force to stack 206.

Once stack 206 has been compressed, the dielectric barrier 210 between two adjacent wafers 202 may be equal to the thickness of the dielectric coating 200 on each wafer 202 plus the thickness of the bonding agent 208 left in the bond line 204 between the wafers 202. Thus, dielectric coating 200 and any bonding agent 208 that is left between wafers 202 after stack 206 is compressed may electrically and thermally insulate wafers 202 from one another in stack 206. In particular embodiments, once stack 206 has been compressed, each dielectric barrier 210 may be approximately 30 microns thick, assuming the thickness of dielectric coating 200 is approximately 12 microns. Compressing stack 206 so that the dielectric barrier 210 between each adjacent wafer is minimized, may help to reduce the overall thermal expansion of thermoelectric device 226 (as depicted in the example embodiment of FIG. 7) by lessening the amount of material between the elements 214 that is subject to thermal expansion during operation of the thermoelectric device 226. In particular embodiments, after bonding agent 208 has cured in bond lines 204, stack 206 may be diced into banded wafers 212 as explained in more detail with respect to FIG. 4.

Figure 4:
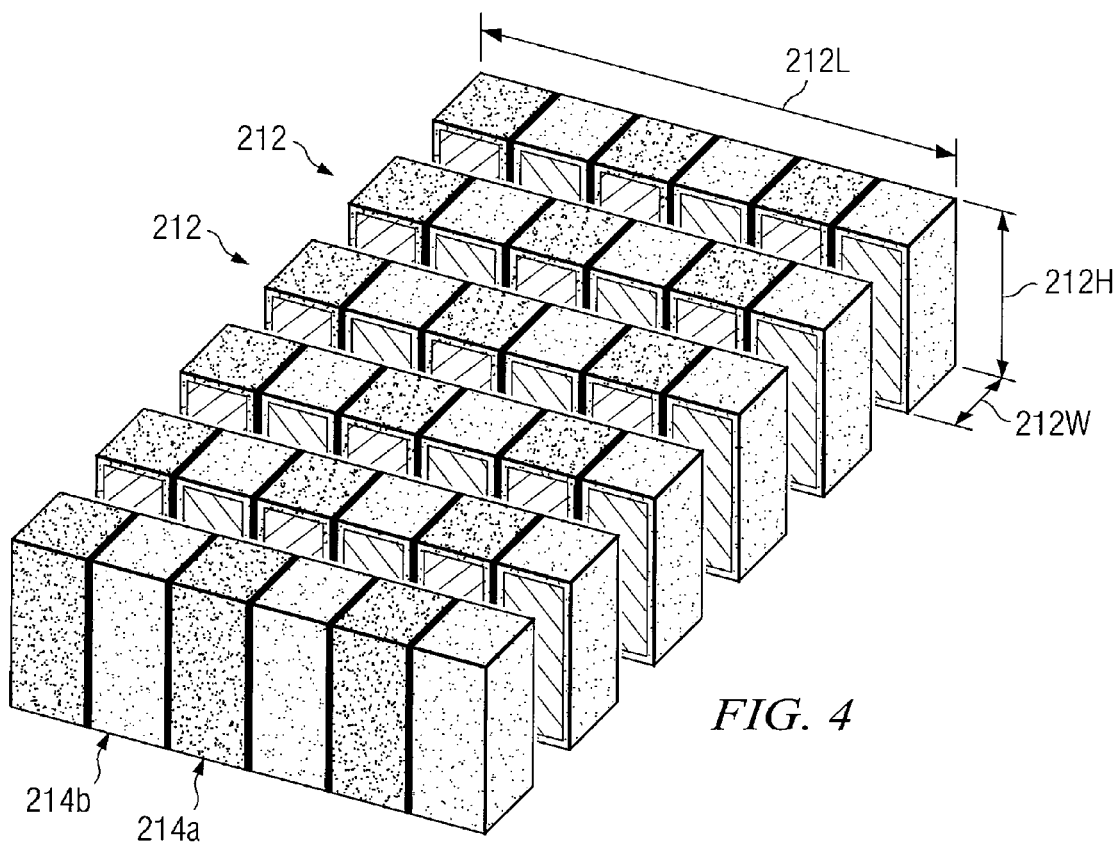
FIG. 4 illustrates an example embodiment of a plurality of banded wafers that have been diced from the bonded stack of FIG. 3 in accordance with an example embodiment of the present disclosure.

FIG. 4 illustrates a plurality of banded wafers 212 that have be diced from stack 206 such as for example in step 110 of FIG. 1. Stack 206 may be diced into banded wafers 212 using any suitable method. As examples and not by way of limitation, banded wafers 212 may be separated from stack 206 using diamond dicing saws, wire saws, acid saws, or laser cutting.

Each banded wafer 212 may have a wafer height 212H, a wafer length 212L, and a wafer width 212W. Though wafers 212 may be any shape or size, a typical wafer 212 may be rectangular in shape, having two large, substantially flat faces surrounded by four narrow edges. By way of example, a wafer 212 could have a wafer width 212W of approximately 0.7 mm, a wafer height 212H of approximately 25 mm, and a wafer length 212L of approximately 12 mm. In particular embodiments, each wafer 212 may be uniform to every other wafer 212 in dimension (e.g., length, width, and height).

As a consequence of cutting wafers 212 transverse to wafers 202, each banded wafer 212 may include an alternating series of P-type elements 214a and N-type elements 214b separated from one another by dielectric barriers 210. Typically, the banded wafers 212 sliced from a particular stack 206 should be kept together and not intermixed with banded wafers from other stacks. Keeping banded wafers 212 from the same stack 206 together may help maintain consistent element geometry and element spacing in the final thermoelectric device 226 that may be constructed from banded wafers 212. In particular embodiments, once stack 206 has been diced into banded wafers 212, banded wafers 212 may be coated with dielectric coating 200 as explained in more detail with respect to FIG. 5.

Figure 5:
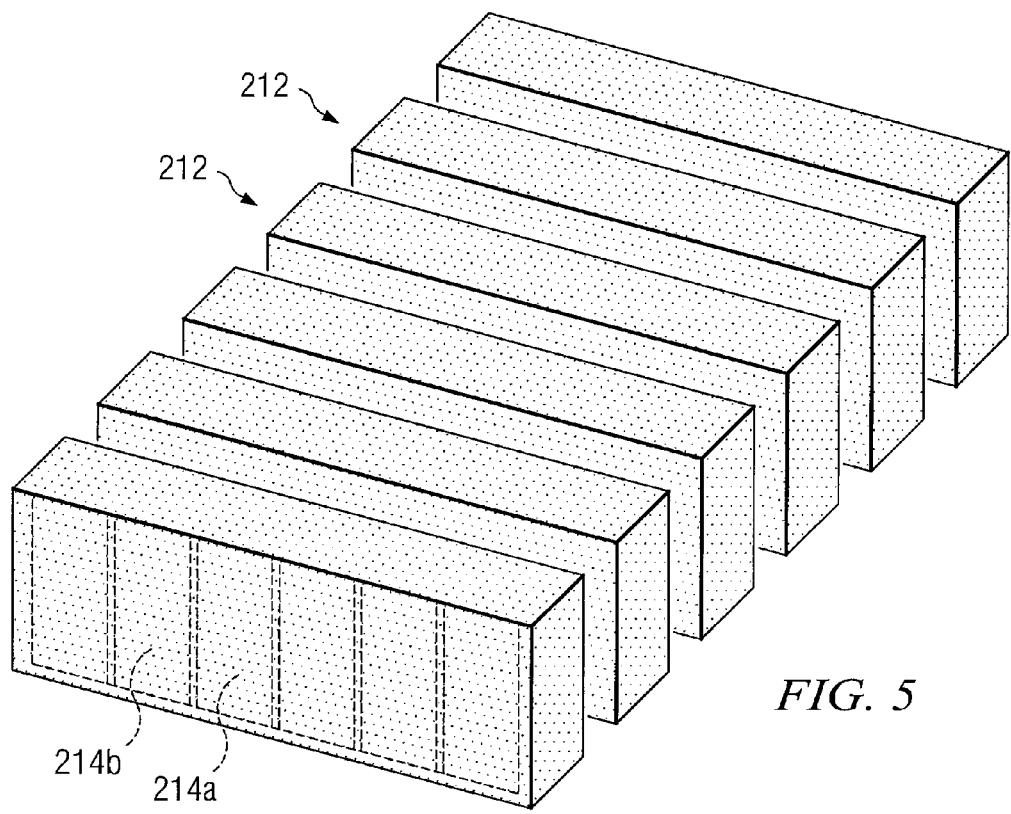
FIG. 5 illustrates an example embodiment of a plurality of banded wafers that have been coated with a dielectric coating in accordance with an example embodiment of the present disclosure.

FIG. 5 illustrates a plurality of banded wafers 212 that have been coated with a second dielectric coating 200 such as for example in step 112 of FIG. 1. In particular embodiments, the second dielectric coating 200 may consist of the same dielectric material used to initially coat wafers 202 as described in step 100 of FIG. 1 and may be applied using the same deposition technique that was used to coat wafers 202 in step 100. In particular embodiments, the second dielectric coating 200 may be identical or similar in thickness to the first dielectric coating 200 applied in step 100. Once the second dielectric coating 200 has been applied to banded wafers 212, banded wafers 212 may be allowed to cure, if necessary. In particular embodiments, after the second dielectric coating 200 has been deposited on wafers 212 and cured if necessary, wafers 212 may be bonded together to form a P/N-type block 216.

Depending upon the intended design of TE device 226, banded wafers 212 may be arranged relative to one another prior to bonding to create a desired arrangement of P-type elements 214a and N-type elements 214b in block 216. For example, banded wafers 212 may be arranged such that elements 214 form a checkerboard pattern in block 216 or banded wafers 212 may be arranged such that P-type elements 214a and N-type elements 214b are arranged in rows in block 216. In particular embodiments, once banded wafers 212 have been arranged relative to one another in a desired configuration, wafers 214 may be bonded together to form block 216 as explained in more detail with respect to FIG. 6.

Figure 6:
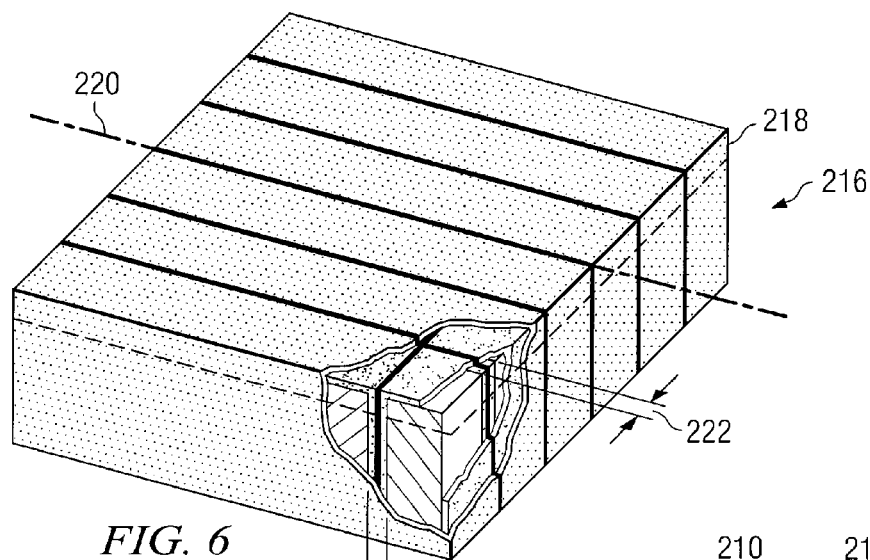
FIG. 6 illustrates an example embodiment of a P/N-type block created from the banded wafers of FIG. 5 in accordance with an example embodiment of the present disclosure.

FIG. 6 illustrates a P/N-type block 216 of dielectric-coated wafers 212 that have been bonded together using a high temperature bonding agent 208 in accordance, for example, with steps 114-120 of FIG. 1.

In particular embodiments, wafers 212 may be bonded together by applying bonding agent 208 to each wafer 212 and pressing wafers 212 together (e.g., before bonding agent 208 hardens) such that the respective faces of each banded wafer 212 touch one another at various points along the bond lines 220. Once wafers 212 have been compressed, the dielectric barrier 222 between each adjacent banded wafer 212 in block 216 may be equal to the thickness of the dielectric coating 200 on each adjacent banded wafer 212 plus the thickness of the bond line 220 between the banded wafers 212.

In particular embodiments, P/N-type block 206 may be designed such that the thickness of each dielectric barrier 222 may be approximately equal to the thickness to each of dielectric barrier 210, resulting in approximately uniform separation of elements 214 in block 216. Additionally, block 216 may be designed such that each of elements 214 may be approximately equal to one another in dimension (e.g., length, width, and height) taking into account any imperfections or tolerance error in the process of manufacturing elements 214. However, one of ordinary skill in the art will appreciate that the present disclosure contemplates creating TE-elements 214 of any desired shape and size, having any desired spacing in block 216. In particular embodiments, once bonding agent 208 has cured, a thermopile array 218 may be sliced from P/N-type block 216 as explained in more detail with respect to FIG. 7.

Figure 7:
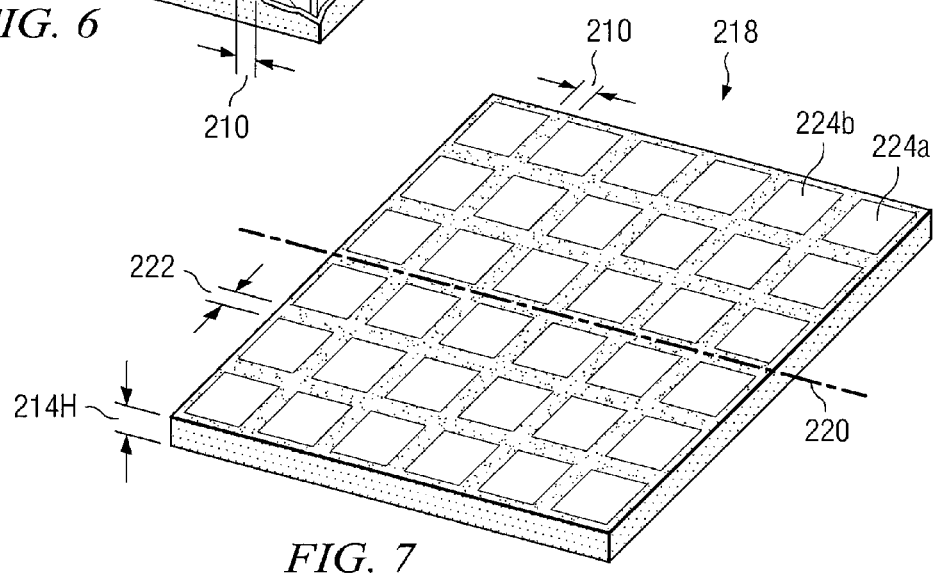
FIG. 7 illustrates an example embodiment of a thermopile array comprised of P-type faces and N-type faces in accordance with an example embodiment of the present disclosure.

FIG. 7 illustrates a thermopile array 218 sliced from block 216 such as for example in step 122 of FIG. 1. Additionally, the top and bottom surfaces of array 218 may be removed (e.g., sliced, lapped, or ground away) to expose the faces 224 of elements 214 and to adjust the length of the elements 214 to a desired size. One of ordinary skill in the art will appreciate that each P-type face 224a and N-type face 224b represents one end of a corresponding P-type element 214a and N-type element 214b in array 218.

As an example and not by way of limitation, thermopile array 218 may be a square 16 by 16 element array of P-type elements 214a and N-type elements 214b. Accordingly, both sides of thermopile array 218 (e.g., the top and bottom of array 218) may have 128 P-type faces 224b and 128 N-type faces 224a exposed. In an example situation, if array 218 is created from wafers 202 having dimensions similar to the example dimension discussed above with respect to FIG. 2, the surface area of each face 224 may be approximately 0.49 mm² (e.g., 0.7 mm. by 0.7 mm). Additionally, in an example embodiment, the element height 214 H of each element 214 may be approximately 1.3 mm, though one of ordinary skill in the art will appreciate that the present disclosure contemplates elements 214 of any suitable shape and size. Furthermore, if the coating thickness of dielectric barrier 210 and 222 is approximately 12 microns, then each element 214 may be separated from the next by approximately 30 microns of insulating material, yielding a total accumulated thickness of insulating material in each direction (e.g., across the length and width of array 218) of approximately 0.45 mm for a 16×16 element array.

For elements 214 composed of $Bi_2Te_3$, thermopile array 218, when utilized in thermoelectric device 226, may, for example, have maximum operating temperature of 250 degrees Celsius on the hot side and a minimum operating temperature of 25 degrees Celsius (ambient) on the cold side, yielding a temperature variance (delta T) of 225 degrees Celsius across thermopile array 218. One of ordinary skill in the art will appreciate that the above-described dimensions and materials are demonstrative in nature and are merely made with reference to an example thermopile array 218 that may be formed in accordance with the present disclosure. In particular embodiments, once array 218 has been formed, a series of electrical interconnects 228 may be applied to the faces 224 of elements 214 as explained in more detail with respect to FIG. 8.

Figure 8:
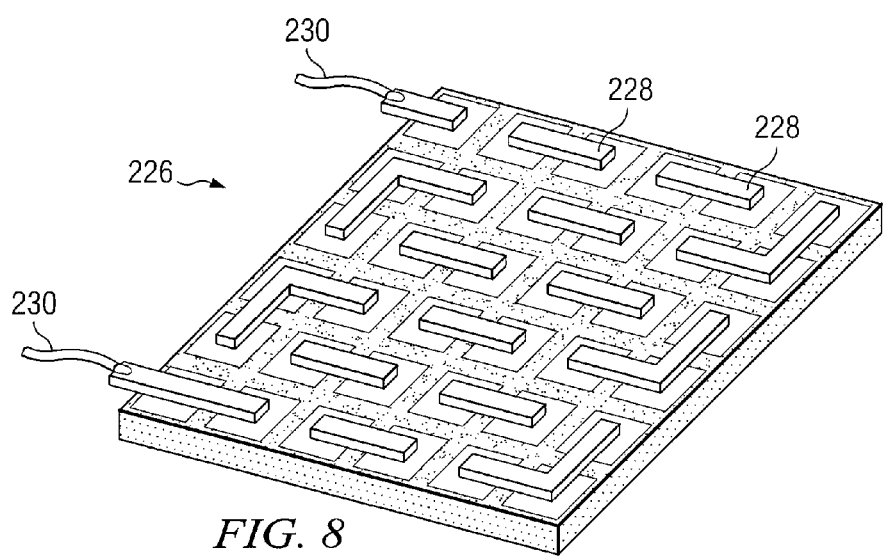
FIG. 8 illustrates an example embodiment of a TE device fabricated from the thermopile array of FIG. 7 in accordance with an example embodiment of the present disclosure.

FIG. 8 illustrates a plurality of electrical interconnects 228 that have been applied to thermopile array 218 to create a thermoelectric device 226 in accordance, for example, with steps 124-126 of FIG. 1. In particular embodiments, to create electrical interconnects 228, a manufacturer may apply a Nickel ("Ni") diffusion barrier (e.g., by sputtering, evaporation, electroless plating or electrolytic plating techniques) and then may apply a solder or braze material to form ductile interconnects 228 between adjacent elements 214. In another example method, a manufacturer may plate or deposit ductile metallic interconnects 228 (e.g., gold, silver, or copper) over the diffusion barriers on faces 224 to electrically interconnect elements 214. One of skill in the art will appreciate that the solder/braze material should be of a higher temperature than the final operating temperature of the device 226 in order to avoid melting of the solder/braze material during operation of device 226. In particular embodiments, leads 230 may be attached to device 226 to supply electricity to device 226. In particular embodiments, the entirety of device 226 may be coated in dielectric coating 200 once the leads and electrical interconnects 228 have been applied to thermopile array 218. Depending upon design, ceramic plates or flexible substrates may further be added to the top and bottom of TE device 226.

Although the present disclosure has been described in several embodiments, a myriad of changes, substitutions, and modifications may be suggested to one skilled in the art, and it t is intended that the present disclosure encompass such changes, substitutions, and modifications as fall within the scope of the present appended claims Moreover, none of the methodology described herein should be construed as a limitation on the order of events insofar as one of skill in the art would appreciate that such events could be altered without departing from the scope of the disclosure.

The invention claimed is:

1. A method for creating an array of thermoelectric elements, comprising:
   applying a first coating of dielectric material to P-type wafers and N-type wafers to form coated P-type wafers and coated N-type wafers;
   forming a P/N-type ingot from the coated P-type wafers and the coated N-type wafers, the coated P-type wafers and the coated N-type wafers alternatingly arranged in the P/N-type ingot;
   slicing from the P/N-type ingot, P/N-type wafers comprising P-type elements and N-type elements;

applying a second coating of dielectric material to the P/N-type wafers to form coated P/N-type wafers; and forming a P/N-type array from the coated P/N-type wafers, wherein the second coating of dielectric material is operable to electrically insulate adjacent elements in the P/N-type array from one another.

2. The method of claim 1, further comprising removing the dielectric material from a top surface and a bottom surface of the P/N-type array to expose faces of the P-type elements and the N-type elements.

3. The method of claim 2, further comprising trimming the P/N-type array to shorten the P-type elements and the N-type elements to a desired length.

4. The method of claim 3, further comprising forming a thermoelectric device from the P/N-type array by applying electrical interconnects to the faces of the P-type elements and the N-type elements.

5. The method of claim 4, further comprising applying a third coating of dielectric material to the thermoelectric device.

6. The method of claim 1, wherein forming a P/N-type ingot comprises:
applying adhesive to the coated P-type wafers and the coated N-type wafers;
stacking the coated P-type wafers and the coated N-type wafers in an alternating relationship;
pressing the coated P-type wafers and the coated N-type wafers together to decrease widths of first bond lines between coated P-type wafers and the coated N-type wafers; and
curing the adhesive to form the P/N-type ingot.

7. The method of claim 6, comprising pressing the coated P-type wafers and the coated N-type wafers together until the coated P-type wafers and the coated N-type wafers touch one another along the first bond lines.

8. The method of claim 1, wherein forming a P/N-type array from the P/N-type wafers, comprises:
applying adhesive to the coated P/N-type wafers;
stacking the coated P/N-type-wafers;
pressing the coated P/N-type wafers together to decrease widths of second bond lines between coated P/N-type wafers;
curing the adhesive to form a P/N-type block; and
slicing the P/N-type array from the P/N-type block.

9. The method of claim 8, comprising pressing the coated P/N-type wafers together until the coated P/N-type wafers touch one another along the second bond lines.

10. The method of claim 9, further comprising removing any excess adhesive that is squeezed out of the first bond lines or the second bond lines.

11. The method of claim 1, wherein the dielectric material comprises a high temperature dielectric material adapted to withstand a full range of operating temperatures produced by a thermoelectric device built from the thermoelectric array.

12. The method of claim 1, wherein the first coating is uniform in thickness.

13. The method of claim 1, wherein the second coating is uniform in thickness.

14. The method of claim 1, wherein the first coating is equal in thickness to the second coating.

15. The method of claim 1, further comprising arranging the P/N-type wafers such that the P-type elements and the N-type elements form a checkerboard pattern in the P/N-type array.

16. The method of claim 1, wherein each coated wafer of the coated P-type wafers and the coated N-type wafers is uniform in dimension to every other coated wafer of the coated P-type wafers and the coated N-type wafers.

17. The method of claim 1, wherein each coated wafer of the coated P/N-type wafers is uniform in dimension to every other coated wafer of the coated P/N-type wafers.

18. A method for creating an array of thermoelectric elements, comprising:
applying a first coating of dielectric material to P-type wafers and N-type wafers to form coated P-type wafers and coated N-type wafers;
applying adhesive to the coated P-type wafers and the coated N-type wafers;
stacking the coated P-type wafers and the coated N-type wafers in an alternating relationship;
pressing the coated P-type wafers and the coated N-type wafers together to decrease widths of first bond lines between coated P-type wafers and the coated N-type wafers; and
curing the adhesive to form the P/N-type ingot, the coated P-type wafers and the coated N-type wafers alternatingly arranged in the P/N-type ingot;
slicing from the P/N-type ingot, P/N-type wafers comprising P-type elements and N-type elements;
applying a second coating of dielectric material to the P/N-type wafers to form coated P/N-type wafers; and
applying adhesive to the coated P/N-type wafers;
stacking the coated P/N-type-wafers;
pressing the coated P/N-type wafers together to decrease widths of second bond lines between coated P/N-type wafers;
curing the adhesive to form a P/N-type block, the P/N-type block comprising the P-type elements and the N-type elements.

19. The method of claim 18, comprising pressing the coated P/N-type wafers together until the coated P/N-type wafers touch one another along the second bond lines.

20. A method for creating an array of thermoelectric elements, comprising:
first applying a first coating of dielectric material to P-type wafers and N-type wafers to form coated P-type wafers and coated N-type wafers;
second forming a P/N-type ingot from the coated P-type wafers and the coated N-type wafers, the coated P-type wafers and the coated N-type wafers alternatingly arranged in the P/N-type ingot;
third slicing from the P/N-type ingot, P/N-type wafers comprising P-type elements and N-type elements;
fourth applying a second coating of dielectric material to the P/N-type wafers to form coated P/N-type wafers; and
fifth forming a P/N-type array from the coated P/N-type wafers, wherein:
the second coating of dielectric material is operable to electrically insulate adjacent elements in the P/N-type array from one another; and
the steps are performed in the order in which they are numbered.

21. The method of claim 1, wherein each wafer of the P-type wafers and N-type wafers comprises a first flat face disposed opposite a second flat face, the first and second flat faces surrounded by a common, narrow edge.

* * * * *